United States Patent [19]

Glendinning et al.

[11] 4,105,805

[45] Aug. 8, 1978

[54] FORMATION OF METAL NITRIDE OXIDE SEMICONDUCTOR (MNOS) BY ION IMPLANTATION OF OXYGEN THROUGH A SILICON NITRIDE LAYER

[75] Inventors: William Bernard Glendinning, Red Bank; Albert Mark, Toms River, both of N.J.

[73] Assignee: The United States of America as represented by the Secretary of the Army, Washington, D.C.

[21] Appl. No.: 757,550

[22] Filed: Dec. 29, 1976

[51] Int. Cl.$^2$ .......................... B05D 3/06; B05D 5/12
[52] U.S. Cl. ........................... 427/38; 427/93; 427/94; 156/646; 148/1.5; 29/576 B; 29/578; 357/54; 357/91
[58] Field of Search ...... 427/38, 94; 29/578, 29/576 B; 148/1.5; 357/54, 91

[56] References Cited

U.S. PATENT DOCUMENTS

| | | | |
|---|---|---|---|
| 3,574,014 | 4/1971 | Hugle | 427/94 |
| 3,586,542 | 6/1971 | MacRae | 427/38 |
| 3,622,382 | 11/1971 | Brack et al. | 427/38 |
| 3,666,548 | 5/1972 | Brack et al. | 427/38 |
| 3,707,765 | 1/1973 | Coleman | 29/578 |
| 3,853,496 | 12/1974 | Kim | 357/54 |
| 3,873,373 | 3/1975 | Hill | 148/1.5 |
| 3,877,055 | 4/1975 | Fisher et al. | 357/54 |
| 3,897,274 | 7/1975 | Stehun et al. | 357/91 |
| 3,925,804 | 12/1975 | Cricchi et al. | 357/54 |

FOREIGN PATENT DOCUMENTS 7,604,237  10/1976  Netherlands .................. 357/54

OTHER PUBLICATIONS

Watanabe et al., "Formation of SiO$_2$ Films by Oxygen-Ion Bombardment," Japan J. Appl. Phys. 5 (1966), pp. 737–738.

*Primary Examiner*—John T. Goolkasian
*Attorney, Agent, or Firm*—Nathan Edelberg; Jeremiah G. Murray; Roy E. Gordon

[57] ABSTRACT

A layer of silicon nitride (Si$_3$N$_4$) is deposited on a silicon substrate. A mask provided with windows representing device structures is then formed over the silicon nitride layer. Oxygen is then implanted through the window portion of the silicon nitride layer into the Si$_3$N$_4$/Si interface region to form a tunneling insulator interface layer of silicon dioxide (SiO$_2$). The final structure is heat treated and then has the form Si$_3$N$_4$/SiO$_2$/Si. It can be made into a metal nitride oxide semiconductor (MNOS) field effect transistor device by conventional diffusion, ion implant and metallization processes.

18 Claims, No Drawings

FORMATION OF METAL NITRIDE OXIDE SEMICONDUCTOR (MNOS) BY ION IMPLANTATION OF OXYGEN THROUGH A SILICON NITRIDE LAYER

The invention described herein may be manufactured, used, and licensed by or for the Government for governmental purposes without the payment to us of any royalties thereon.

BACKGROUND OF THE INVENTION

This invention relates in general to a method of treating silicon and in particular, to such a method that results in the fabrication of an MNOS field effect transistor with improved memory retention characteristics.

Heretofore, in the manufacture of the MNOS transistor device structure, the critical $SiO_2$ layer has been formed by employing vapor or liquid chemical techniques. The $SiO_2$ layer is only about 25 to 50 angstroms in thickness but its composition is significant in determining transistor turn-on threshold voltage and $Si_3N_4$/$SiO_2$ retention characteristics. With the vapor and liquid techniques, it has been difficult to precisely control the oxidation reaction in which $SiO_2$ is produced in the surface of the silicon wafer. This is because one cannot precisely control the quantity of oxygen atoms that are available for oxidation of the silicon. In addition, in the liquid and vapor chemical techniques, it is difficult to control the uniformity of the oxidation reaction across the silicon wafer and also to control the amount of oxygen atoms introduced into the silicon from one oxidation run to another.

Moreover, in the liquid and vapor chemical techniques, foreign atoms are introduced into the silicon during the oxidation. These foreign atoms or contaminants remain in the silicon oxide and contribute to the degradation of subsequent device structures.

SUMMARY OF THE INVENTION

The general object of this invention is to provide a method of forming a tunneling insulator interface layer of $SiO_2$ in the $Si_3N_4$/Si interface region of a silicon semiconductor substrate in which a layer of $Si_3N_4$ has been deposited on the top surface of the substrate. A further object of the invention is to provide such a method that offers extreme precision in the control of the oxide profile shape. A still further object of the invention is to provide such a method in which the resulting structure has the form $Si_3N_4$/$SiO_2$/Si and in which the $SiO_2$ layer is free from foreign atoms. A particular object of the invention is to provide such a metod in which the resulting $Si_3N_4$/$SiO_2$/Si structure can be made into an MNOS field effect transistor device.

It has now been found that the foregoing objects can be attained by using an ion implanation technique for the formation of the $SiO_2$ tunneling insulator interface layer. More particularly, according to the invention, a suitable semiconductor substrate such as p-type silicon is first placed in a reaction chamber and the system either evacuated or purged with an inert gas. The top surface of the semiconductor substrate is then etched with HCl gas to remove oxide impurities and contaminants. A layer of $Si_3N_4$ of about 500 angstroms in thickness is then deposited on the impurity free top surface of the silicon. A mask provided with windows representing device structures is then formed over the silicon nitride layer. The mask may be a metallic material or an organic material as for example, photoresist. Oxygen is then implanted through the window or unmasked portion of the silicon nitride layer into the silicon nitride/silicon interface region at room temperature for about 30 minutes and at an accelerating potential of about 30 to 60 kv. After removing the mask, the oxygen implanted silicon substrate is annealed in a flowing atmosphere of nitrogen at about 1000° C. for about 30 minutes. The final structure has the form $Si_3N_4$/$SiO_2$/Si and can be made into a field effect transistor device by conventional diffusion, ion implant, and metallization processes.

DESCRIPTION OF THE PREFERRED EMBODIMENT

A wafer of p-type silicon of <100> orientation is placed in a RF induction heated reaction chamber and the system then purged with helium to remove oxygen and water vapor. The top surface of the wafer is then etched with HCl gas at an elevated temperature of about 1000° C. to remove oxide impurities and other contaminants from the silicon surface. An amorphous layer of silicon nitride of about 500 angstroms in thickness is then deposited on the impurity free top surface of the silicon. A photoresist mask provided with windows representing device structures is then formed over the silicon nitride layer. The mask is about one micron thick. Oxygen is then implanted through the window portion of the silicon nitride layer into the silicon nitride/silicon interface region. The implanatation is carried out at room temperature for about 30 minutes at an accelerating potention of 30 to 60 kv. This results in a concentration of 2 to 5 ($10^{16}$) oxygen atoms per square centimeter at the silicon nitride/silicon interface. A layer of silicon dioxide of about 20 to 50 angstroms is formed. The photoresist mask is then removed from the silicon nitride layer with vapor plasma. The treated silicon substrate is then annealed in a flowing atmosphere of nitrogen at about 1000° C. for about 30 minutes. The resulting structure has the form $Si_3N_4$/$SiO_2$/Si. This structure is then made into a field effect transistor device by conventional diffusion, ion implant, and metallization processes.

In the method, the particular silicon substrate chosen and its orientation are not critical. That is, the silicon substrate might be p-type or n-type and its orientation might be <100>, <111>, etc.

The silicon nitride is deposited on the impurity free top surface of the silicon substrate as an amorphous layer of about 300 to 700 angstroms in thickness in about 3 to 4 minutes. The silicon nitride can be conveniently obtained by the reaction of silane with ammonia at a temperature of about 750° C.

Examples of specific masking materials that can be used in the invention include aluminum, platinum or titanium.

Ion implantation can be conveniently carried out using a 300kv ion implanter. However, the particular ion implanter used is not critical. What is critical however is that during the implanatation, the surface accumulation of oxygen atoms or dose required to form $SiO_2$ at the $Si_3N_4$/Si interface region be on the order of 2 to 5 ($10^{16}$) oxygen atoms/cm².

The method of the invention results in a tunneling insulator interface layer of silicon dioxide that is more uniform in thickness and reproducible from one oxidation run to another. The silicon dioxide layer is also free of contaminants. These characteristics of the silicon dioxide layer enable the resulting silicon nitride/silicon dioxide/silicon structure to be made into devices having improved memory retention and endurance.

We wish it to be understood that we do not desire to be limited to the exact details shown and described, for obvious modifications will occur to a person skilled in the art.

What is claimed is:

1. Method of treating a silicon substrate including the steps of
   (A) placing the silicon substrate in a reaction chamber and then purging the chamber with an inert gas to remove oxygen and water vapor;
   (B) etching the top surface of the substrate with hydrogen chloride gas to remove impurities and other contaminants from the silicon surface;
   (C) depositing a layer of silicon nitride of about 300 to 700 angstroms in thickness on the top surface of the silicon substrate;
   (D) forming a mask provided with windows representing device structures over the silicon nitride layer;
   (E) implanting oxygen through the window portion of the silicon nitride layer into the silicon nitride/silicon interface region at room temperature for about 30 minutes and at an accelerating potential of 30 to 60 kv to obtain a concentration of 2 to 5 ($10^{16}$) oxygen atoms per square centimeter at the silicon nitride silicon interface during the oxygen implantation to form a tunneling insulator interface layer of silicon dioxide;
   (F) removing the mask from the silicon nitride; and
   (G) annealing the oxygen implanted silicon in a flowing atmosphere of nitrogen at about 1000° C. for about 30 minutes to obtain the structure silicon nitride/silicon dioxide/silicon.

2. Method according to claim 1 wherein the silicon substrate is p-type silicon.

3. Method according to claim 1 wherein the silicon substrate is n-type silicon.

4. Method according to claim 2 wherein the p-type silicon is of <100> orientation.

5. Method according to claim 2 wherein the p-type silicon is of <111> orientation.

6. Method according to claim 3 wherein the n-type silicon is of <100> orientation.

7. Method according to claim 3 wherein the n-type silicon is of <111> orientation.

8. Method according to claim 1 wherein the reaction chamber in Step (A) is evacuated.

9. Method according to claim 1 wherein the silicon nitride deposited in step (C) is deposited as an amorphous layer.

10. Method according to claim 1 wherein the silicon nitride deposited in step (C) is obtained by the reaction of silane with ammonia at a temperature of about 750° C.

11. Method according to claim 1 wherein the mask in step (D) is selected from the group consisting of a metallic material and an organic material.

12. Method according to claim 11 wherein the metallic material is a member of the group consisting of aluminum, platinum and titanium.

13. Method according to claim 12 wherein the metallic material is aluminum.

14. Method according to claim 12 wherein the metallic material is platinum.

15. Method according to claim 12 wherein the metallic material is titanium.

16. Method according to claim 11 wherein the organic material is a photoresist.

17. Method according to claim 1 wherein the layer of silicon dioxide formed in step (E) is about 20 to 50 angstroms in thickness.

18. Method of treating a wafer of p-type silicon of <100> orientation, said method consisting of
   (A) placing the wafer in a RF induction heated reaction chamber and then purging the chamber with helium to remove oxygen and water vapor,
   (B) etching the top surface of the wafer with HCl gas at an elevated temperature of about 1000° C. to remove oxide impurities and other contaminants from the silicon surface,
   (C) depositing an amorphous layer of silicon nitride of about 500 angstroms in thickness on the impurity free top surface of the silicon wafer,
   (D) forming a photoresist mask provided with windows representing device structures over the silicon nitride layer,
   (E) implanting oxygen through the window portion of the silicon nitride layer into the silicon nitride/silicon interface region at room temperature for about 30 minutes and at an accelerating potential of 30 to 60 kv to obtain a concentration of 2 to 5 ($10^{16}$) oxygen atoms per square centimeter at the silicon nitride/silicon interface during the oxygen implantation and form a tunneling insulator interface layer of silicon dioxide,
   (F) removing the mask from the silicon nitride with vapr plasma, and
   (G) annealing the oxygen implanted silicon in a flowing atmosphere of nitrogen at about 1000° C. for about 30 minutes to obtain the structure silicon nitride/silicon dioxide/silicon.

* * * * *